United States Patent
Murayama et al.

(10) Patent No.: US 6,280,843 B1
(45) Date of Patent: Aug. 28, 2001

(54) WHOLLY AROMATIC POLYAMIDE FIBERS, A SHEET COMPRISING SAME AND METHOD OF PRODUCING THE SHEET

(75) Inventors: Sadamitsu Murayama; Masanori Wada; Michikage Matsui, all of Ibaraki (JP)

(73) Assignee: Teijin Limited, Osaka (JP)

( * ) Notice: Subject to any disclaimer, the term of this patent is extended or adjusted under 35 U.S.C. 154(b) by 0 days.

(21) Appl. No.: 09/324,909

(22) Filed: Jun. 3, 1999

(30) Foreign Application Priority Data

Jun. 3, 1998 (JP) .................................................. 10-154453
Mar. 8, 1999 (JP) .................................................. 11-059851

(51) Int. Cl.$^7$ ............................ D01F 6/60; D01D 10/02; D04H 1/42
(52) U.S. Cl. ........................... 428/408; 428/902; 528/170; 528/183; 528/337; 528/348; 528/481; 528/499; 442/60; 442/179; 442/334; 442/394; 264/184; 264/203; 264/336
(58) Field of Search ..................................... 528/170, 183, 528/337, 348, 481, 499; 442/179, 334, 394, 60; 428/408, 902; 264/184, 203, 336

(56) References Cited

U.S. PATENT DOCUMENTS 3,869,430 * 3/1975 Blades .

FOREIGN PATENT DOCUMENTS

| | | | |
|---|---|---|---|
| 0 178 943 | 4/1986 | (EP) . | |
| 0 178 943 B1 | 4/1986 | (EP) . | |
| 0 247 889 | 12/1987 | (EP) . | |
| 0 247 889 B1 | 12/1987 | (EP) . | |
| 0 790 341 A2 | 9/1997 | (EP) . | |
| 1 391 501 | 4/1975 | (GB) . | |
| 2 044 668 | 10/1980 | (GB) . | |
| 2 311 304 | 9/1997 | (GB) . | |
| 62-218425 | 9/1987 | (JP) | C08J/7/00 |
| 62-225539 | 10/1987 | (JP) | C08J/7/16 |
| 4-14277 | 1/1992 | (JP) | H01S/3/18 |
| 5-83096 | 4/1993 | (JP) | H03K/5/13 |
| 6-280140 | 10/1994 | (JP) | D04B/1/28 |

* cited by examiner

Primary Examiner—Richard Weisberger
(74) Attorney, Agent, or Firm—Sughrue, Mion, Zinn, Macpeak & Seas, PLLC

(57) ABSTRACT

Aromatic polyamide fibers which have a crystalline structure having (1) crystal size (A) in a (110) plane of 7.5 nm, (2) crystal size (B) in a (200) plane of 8.2 nm and (3) a product A×B of 61.50 to 630.00, and exhibit a thermal linear expansion coefficient of $-1.0\times10^{-6}/°$ C. to $-7.5\times10^{-6}/°$ C. and thus a high dimensional stability even upon moisture-absorbing and desorbing, are useful for forming a resin-reinforcing fiber sheet, a pre-preg containing the fiber sheet, and a laminate for, for example, an electric insulating material or electric circuit board, having an excellent cutting, shaving, perforating or laser processability and capable of forming a smooth cut, shaved or perforated face.

36 Claims, No Drawings

WHOLLY AROMATIC POLYAMIDE FIBERS, A SHEET COMPRISING SAME AND METHOD OF PRODUCING THE SHEET

BACKGROUND OF THE INVENTION

1. Field of the Invention

The present invention relates to wholly aromatic polyamide fibers, a sheet comprising same and a method of producing the sheet. More particularly, the present invention relates to wholly aromatic polyamide fibers having a high heat resistance and an excellent electric insulating property under high temperature and high humidity conditions, and a sheet comprising the heat resistant and electrically insulating wholly aromatic polyamide fibers and at least one member selected from binder resins and heat resistant organic polymer fibrids, and usable as an electric insulating material, and a method of producing the wholly aromatic polyamide fibers.

2. Description of the Related Art

It is well-known that wholly aromatic polyamide fibers have excellent heat resistance and mechanical strength and thus are useful for various uses.

In the case where the wholly aromatic polyamide fibers are used as a resin-reinforcing material, for example, FRP material or parts of OA machines and devices which have to exhibit a very accurate dimensional stability, however, the dimensions of the aromatic polyimide fibers in the longitudinal direction thereof and in the transverse directions at right angles from the longitudinal direction change to a great extent in an atmosphere in which an increase and a decrease of the temperature are repeated, and the change in the dimensions due to absorption and desorption of moisture in the fibers is significant. Therefore, in a fiber-reinforced resin composite laminate plate, a strain is created in the interfaces between the reinforcing fibers and the resin, and the strain causes the laminate plate to exhibit a reduced durability to repeated load, and an interfacial separation occurs. Particularly, when used as an electric insulation material while an electric current is flowed therethrough for a long period, water is accumulated in a small amount in the interfaces between the resin and the reinforcing fibers, to promote movement of impurity ions contained in the resin or fibers, or to cause an interfacial separation due to a temperature-increase and water-evaporation. As an attempt for solving the above-mentioned problems, for example, Japanese Unexamined Patent Publication No. 5-83,096, No. 62-218,425 and No. 62-225,539 discloses a method of improving interfacial adhesion of aromatic polyamide fibers to a resin by heat treatment. However, this method is disadvantageous in that the fiber-reinforced resin material has a high content of impurity ions and a high moisture content, and thus is unsuitable for electrically insulating uses. These problems have not yet been fully solved.

The wholly aromatic polyamide fibers have a very high resistance to cutting and thus are used in various protective materials as disclosed in, for example, Japanese Unexamined Patent Publications No. 4-14,277, No. 6-280,140. However, this very high cutting resistance causes such a problem in that when a resin composite laminate plate reinforced by the wholly aromatic polyamide fibers is subjected to a piercing work with a drill, the reinforcing fibers are not sharply cut, the reinforcing fibers are divided into fine fibrils or not completely cut, and thus the resultant hole has a rough inner face. Particularly, in recent piercing work, a very small size of hole is required to be formed with a high accuracy, and thus a new piercing method using a carbon dioxide gas laser has been attempted. Therefore, a solution of the above-mentioned problem is strongly demanded in industry.

Also, when the fiber-reinforced composite resin laminate material is subjected to cutting work, the reinforcing fibers are not sharply cut and the resultant fine fibrils from the reinforcing fibers project from the cut face. This problem must be solved.

SUMMARY OF THE INVENTION

An object of the present invention is to provide holly aromatic polyamide fibers having a very high dimensional stability even when employed in an atmosphere in which the temperature repeatedly changes and in which the moisture is absorbed by or desorbed from the fibers, a sheet comprising the fibers and a method of producing the fibers.

Another object of the present invention is to provide wholly aromatic polyamide fibers which, when used as reinforcing fibers for a fiber-reinforced resin composite laminate plate, and subjected to a piercing, cutting or laser treatment work, can be sharply cut, exhibit a high resistance to fibril-formation from the fibers, and thus cause the laminate plate to exhibit smooth and sharp cut faces, a sheet comprising the fibers, and a method of producing the sheet.

The above-mentioned objects can be attained by the wholly aromatic polyamide fibers, the sheet comprising the fibers and the method of producing the sheet, of the present invention.

The wholly aromatic polyamide fibers of the present invention are characterized by comprising wholly aromatic polyamide crystals having apparent crystal sizes determined from a wide angle X-ray diffraction intensity curve in accordance with the Scherrer's equation and satisfying the requirements (1), (2) and (3);

(1) the crystal size (A) in a (110) plane is 7.5 nm (75 angstroms) or more, (2) the crystal size (B) in a (200) plane is 8.2 nm (82 angstroms) or more, and (3) the product (A×B) of the crystal size (A) and the crystal size (B) is 61.50 to 630.00, and having a thermal linear expansion coefficient within the range of from $-1.0 \times 10^{-6}/°C$. to $-7.5 \times 10^{-6}/°C$.

In the wholly aromatic polyamide fibers of the present invention, when the wholly aromatic polyamide fibers in an amount of 2 g are cut into a short length of 1 mm or less and immersed in 50 ml of a distilled water, and are heat-treated in an autoclave at a temperature of 121° C. under a pressure of 2 $kg/cm^2G$, to extract impurity ions from the fibers, and the extracted impurity ion-containing water is subjected to a ICP analysis and to a chromatographic analysis to determine the amount of the extracted impurity ions, namely sodium, potassium and chlorine ions, per liter of the extracted impurity ion-containing water, the extracted impurity ions preferably satisfy the requirements (a), (b) and (c):

(a) the amount of the extracted sodium ions is not more than 40 mg/liter.

(b) the amount of the extracted potassium ions is not more than 3.0 mg/liter, and (c) the amount of the extracted chlorine ions is not more than 7.5 mg/liter.

The wholly aromatic polyamide fiber sheet of the present invention comprises, as principal components, 60 to 96% by weight of wholly aromatic polyamide staple fibers, and 4 to 40% by weight of at least one member selected from the group consisting of organic resin binders and heat-resistant organic polymer fibrids, said wholly aromatic polyamide staple fibers containing the specific wholly aromatic polyamide fibers of the present invention in the form of staple fibers.

The wholly aromatic polyamide fiber sheet of the present invention preferably has a maximum change in the longitudinal dimension of 50 μm or less per length of 20 mm, determined by such a test method for dimensional change of a sheet due to moisture-absorption and desorption of the sheet, that a sample of the sheet having a length of 20 mm and a width of 5 mm is left standing in the ambient atmosphere at room temperature at a relative humidity of 85% RH or more for 120 hours or more to allow the sheet to fully absorb moisture; the moisture-absorbed sheet sample is subjected to heating to a temperature of 280° C. at a heating rate of 10° C./minute, then to cooling to room temperature at a cooling rate of 10° C./minute to dry the sheet sample, the above-mentioned heating and cooling procedures being repeated three times in total under the same conditions as mentioned above; and a maximum change in the longitudinal dimension of the sheet sample generated during the repeated heating and cooling procedures is measured per 20 mm in the longitudinal dimension.

The method of the present invention for producing a wholly aromatic polyamide fiber sheet containing the specific wholly aromatic polyamide fibers of the present invention in the form of staple fiber, comprises; preparing an aqueous staple fiber slurry by dispersing aromatic polyamide staple fibers containing the above-mentioned specific wholly aromatic polyamide fibers in the form of staple fibers and heat resistant organic polymer fibrids in an aqueous medium; subjecting the aqueous staple fiber slurry to a paper-forming procedure; drying the resultant wet paper-like sheet; heat-pressing the dried sheet at a temperature of 210 to 400° C. under a linear pressure of 150 to 250 kg/cm, to partially soften, or melt or soften and melt the heat-resistant organic polymer fibrids in the dried sheet and thereby to causing the fibrids to be bonded to each other and to the aromatic polyamide staple fibers.

The wholly aromatic polyamide fiber sheet of the present invention can be used to produce a pre-preg by impregnating the wholly aromatic polyamide fiber sheet with a thermosetting resin.

The pre-preg is used to produce a shaped article, particularly a perforated shaped article, and a laminate plate, particularly a perforated laminate plate.

The perforated shaped article or laminate plate can be produced by a laser perforation method.

DESCRIPTION OF THE PREFERRED EMBODIMENTS

The inventors of the present invention have made an extensive study for attaining the above-mentioned objects and found that when a fiber-reinforced resin article is subjected to a laser perforation work, there is a difference in decomposition temperature between the reinforcing fibers and the resin and thus, to form a satisfactory hole, a portion of the reinforcing fibers must be melted to form a smooth cylindrical inner wall surface of the hole. Also, it was determined that the formation of the smooth inner wall surface is governed to a large extent by proportions of crystal portions and amorphous portions of the fibers and the apparent crystal size and thus, when the proportions and the apparent crystal size are not appropriate the smooth inner surface of the hole cannot be formed. Further, it was found that when a small amount of p-type aromatic polyamide fibers which can be easily softened and melted and have a high ultimate elongation are contained in the reinforcing fibers, the resultant hole has a smooth inner wall surface. The present invention has been completed on the basis of the above-mentioned findings.

The smoothness and sharpness of the finished surface formed by a cutting, shaving or drill-perforating work are governed to a great extent by the apparent crystal size of the reinforcing fibers as mentioned above. When the reinforcing fibers include, as a portion thereof, a small amount of p-type polyamide fibers having a high ultimate elongation, and thus a high deformability, and are capable of being easily softened and melted, and the p-type polyamide fiber-containing resin composition is formed into a fiber-reinforced resin-based material, a shaped article or a laminate plate by a heat-pressing procedure, the p-type polyamide fibers are deformed, softened and partially melted during the heat-pressing procedure, to promote the intertwinement and adhesion with other reinforcing fibers and to increase the adhesion areas between the reinforcing fibers. Therefore, the reinforcing fibers in the shaped article or laminate plate are fixed with each other, and when the shaped article or laminate plate is subjected to a cutting, shaving or drill-perforating work, the fixed reinforcing fibers can be sharply cut by a cutter or drill without escaping from the cutter or drill, and thus the cut face of the shaped article or laminate plate is very smooth and sharp.

The wholly aromatic polyamide fibers of the present invention comprises crystals of the wholly aromatic polyamide having specific apparent crystal sizes determined from a wide angle X-ray diffraction intensity curve thereof in accordance with Scherrer's equation. Namely, the wholly aromatic polyamide crystal sizes must satisfy the requirements (1), (2) and (3):

(1) the crystal size (A) in a (110) plane is 7.5 nm (75 angstroms) or more, (2) the crystal size (B) in a (200) plane is 8.2 nm (82 angstroms) or more, and (3) the product (A×B) of the crystal size (A) in nm and the crystal size (B) in nm is 61.50 to 630.00.

Also, the specific wholly aromatic polyamide fibers have a thermal linear expansion coefficient within the range of from $-10 \times 10^{-6}/°$ C. to $-7.5 \times 10^{-6}/°$ C., preferably from $-10 \times 10^{-6}/°$ C. to $-6.5 \times 10^{-6}/°$ C. Preferably, the crystal size (A) in the (110) plane is 8.5 nm or more, more preferably by 10.0 nm or more, still more preferably 10.5 nm or more, further preferably 11.0 to 27.0 nm; the crystal size (B) in the (200) plane is 8.4 nm or more, more preferably 8.5 nm or more, still more preferably 9.0 nm or more, further preferably 9.5 to 20.0 nm; and the product (A×B) of the crystal size (A) in nm and the crystal size (B) in nm is 71.40 to 630.00, more preferably 85.00 to 630.00, still more preferably 94.50 to 575.00.

When the crystal size (A) in the (110) plane is less than 7.5 nm, the crystal size (B) in the (200) plane is less than 8.2 nm, and/or the product A×B is less than 61.50, the apparent crystal sizes of the aromatic polyamide fibers in the (110) and (200) planes are too small, and when an aromatic polyamide fiber-reinforced shaped article or composite laminate plate is subjected to a drill-perforation work or a shaving work, the aromatic polyamide fibers located at the cut end faces or shaved faces exhibit a high resistance to fibrillation. However, the resultant aromatic polyamide fibers exhibit too low a rigidity and thus are easily deformed, and when the cutter or drill edge comes into contact with the fibers, the fibers can be easily deformed and can easily escape from the cutter or drill edge. Namely, the resultant aromatic polyamide fibers exhibit a decreased cutting or shaving processability.

To enhance the processability of the reinforcing fibers, when a small amount of para-type aromatic polyamide fibers which can be easily softened or deformed or melted rather than the reinforcing aromatic polyamide fibers under the same temperature and pressure conditions, for example, specific p-type aromatic polyamide fibers having an ultimate elongation of 6% or more, are contained in the reinforcing fibers, and the p-type aromatic polyamide fiber-containing reinforcing fibers are used for a production of a fiber-reinforced resin-based material or a resin composite laminate plate, the p-type aromatic polyamide fibers are easily elongated, softened, deformed, or partially melted so as to enhance the intertwinement and adhesion of the reinforcing fibers and to increase the adhesion area of the reinforcing fibers. Therefore, the reinforcing fibers are fixed to each other and are difficult to escape from the cutter or drill edge. Therefore, the resultant fiber-reinforced resin composite laminate plate exhibits an enhanced cutting, perforating and shaving processabilities. However, when the p-type aromatic polyamide fibers do not satisfy the requirements (1), (2) and/or (3) of the present invention, the enhancement in the cutting, perforating and shaving processabilities is unsatisfactory.

For example, the inventors of the present invention have disclosed reinforcing fibers containing a small amount of p-type aromatic polyamide fibers. However, the disclosed p-type aromatic fibers did not satisfy the requirements (1), (2) and (3) of the present invention and should be distinguished from the wholly aromatic polyamide fibers of the present invention which can be easily elongated, deformed and melted at a relatively low temperature. Therefore, the disclosed p-type aromatic polyamide fibers are unsatisfactory in blendability and adhesion with other reinforcing fibers. Also, the disclosed p-type aromatic polyamide fibers exhibit higher softening, deforming and melting temperature than those of the specific wholly aromatic polyamide fibers of the present invention.

Also, when the product (A×B) is more than 630.00, the resultant wholly aromatic polyamide fibers are advantageous in that the resultant aromatic polyamide fibers exhibit a high rigidity and enhanced cutting and shaving processabilities. However, this type of fibers is disadvantageous in that the cut faces of the fibers are easily divided along the longitudinal axes of the fibers and fine fibrils are formed. Therefore, even when the specific p-type aromatic polyamide fibers are mixed in a small amount in the reinforcing fibers, the resultant fiber-reinforced resin composite laminate plate cannot prevent the projection of finely divided fibers in the form of fibrils from the cut or shaved faces thereof, and thus exhibits degraded cutting, shaving and drill-perforating processabilities.

Also, when the fiber-reinforced resin composite laminate plate is subjected to a perforation work by laser, for example, carbon dioxide gas laser, and when the apparent crystal sizes in the (110) and (200) planes of the aromatic polyamide fibers are too small, portions of the resin walls surrounding the holes are carbonized and colored in black color, and the electrical insulation properties of the laminate plate are degraded, and thus the laser-perforated laminate plate cannot be used as an electric insulating material.

In this case, it is confirmed that when the specific wholly aromatic polyamide fibers of the present invention, which are easily softened, deformed or melted, are contained in a small amount in the reinforcing fibers, these specific fibers are melted by a small amount of energy within a short time to form smooth wall faces of the holes, and the black-coloration of the wall faces of the hole due to the carbonization of the resin is restricted. When the apparent crystal sizes are too large, the smooth and sharp faces are not formed on the hole inner surfaces, and thus the resultant inner surfaces of the holes are rough.

The inventors of the present invention have confirmed, as a result of the inventor's extensive study, that the resin composite laminate plates reinforced by the specific aromatic polyamide fibers in which the crystal sizes of the aromatic polyamide crystals are controlled to the ranges as mentioned above, exhibits a very good laser-perforation, cutting and shaving processabilities.

The specific wholly aromatic polyamide fibers of the present invention have a larger crystal size (A) in the (110) plane than that of the conventional aromatic polyamide fibers, and thus have an enhanced degree of crystallization and a decreased content of amorphous portion. Therefore, the specific wholly aromatic polyamide fibers of the present invention are characteristic in decreased dimensional changes both in the fiber axis direction and the transverse direction at right angles to the fiber axis direction, in the atmosphere in which a high temperature and a low temperature are repeatedly generated or in the atmosphere in which a moisture absorption and a moisture desorption of the fibers repeatedly occur.

The specific wholly aromatic polyamide fibers of the present invention have a slightly broader range of the thermal linear expansion coefficient than that of the conventional aromatic polyamide fibers. However, when the specific wholly aromatic polyamide fibers of the present invention which are easily softened, deformed or melted at a relatively low temperature are mixed in a small amount in the reinforcing fibers, the intertwinement of the reinforcing fibers can be controlled. Also, when the specific aromatic polyamide fiber-containing reinforcing fibers are employed in combination with an appropriate resin, the thermal linear expansion coefficient of the resultant fiber-reinforced resin composite material along the surface plane of the material and at right angles to the surface plane can be unlimitedly decreased toward zero. Accordingly, the specific wholly aromatic polyamide fibers of the present invention are appropriate as reinforcing fibers for FRP materials which must have a highly accurate dimensional stability and are useful for aircraft and for resin composite laminate plate materials usable for parts of OA machines and devices. Particularly, the fiber-reinforced resin composite materials usable for the aircraft which are employed under conditions having a large temperature difference, are employed under high load in an atmosphere in which a high temperature and a low temperature are repeatedly applied to the materials. Therefore, generally, the repeated changes in temperature and in humidity cause changes in dimension of the material, and the dimensional changes cause a interfacial separation between the resin and the reinforcing fibers. This problem can be solved by using the specific wholly aromatic polyamide fibers of the present invention, and the resultant fiber-reinforced resin materials can exhibit an enchased durability in practice.

The specific wholly aromatic polyamide fibers of the present invention satisfying the crystal size requirements (1), (2) and (3) surprisingly exhibit a low equilibrium moisture content of 3.2% or less, particularly 2.7% or less, more particularly 2.0% or less at a specific crystal size. This equilibrium moisture content of 3.2% or less is definitely different from that of the conventional typical aromatic polyamide fibers of about 4.5% or more. Therefore, when the composite laminate plate reinforced by the specific fibers of the present invention is used as an electric insulating material, the conventional problem that a small amount of water is accumulated in the interfaces between the resin and the reinforcing fibers, and the impurity ions contained in the accumulated water move through the interfaces while an electric current is applied to the material over a long period, can be solved even in the case where the accumulated water contains a large amount of the impurity ions. Also, another problem that the interfacial separation occurs due to heat-vaporization of the water, can be prevented.

Among the conventional aromatic polyamide fibers, those having an equilibrium moisture content of about 1.5% or less are known. This type of the aromatic polyamide fibers have a outermost surface layers thereof having been heat-oxidized to a great extent, and thus having a decreased surface electric resistance, and thus cannot be used as an electric insulating material. The resistance of the aromatic polyamide fibers to cutting and shaving decreases with increase in moisture content of the fibers. Therefore, the wholly aromatic polyamide fibers of the present invention having above-mentioned low equilibrium moisture content are suitable for use in cloth having a high resistance to heat and/or cutting or shaving (for example, in protective suits).

Also, paper sheet materials for electric insulating materials, particularly printed circuit boards, must be excellent in heat resistance, thermal dimensional stability, resistance to moisture absorption, wet dimensional stability, electric insulating property, light weight, and resistance to deformation during formation into a laminate material (for example, resistances to warping, distortion and corrugation). For these requirements, the aromatic polyamide staple fiber sheets of the present invention significantly contribute to enhancing the above mentioned properties in comparison with the conventional aromatic polyamide staple fiber sheets and other heat resistant organic polymer staple fiber sheets. Also, the aromatic polyamide staple fiber sheets of the present invention exhibit an excellent laser processability and cause the perforation and shaving works in a very small size which have been considered to be impossible when the conventional fiber sheet is used, to be realized.

The aromatic polyamide fibers usable for the sheet of the present invention may be produced from an aromatic polyamide resin selected from homopolyamide having recurring units of the formula (I) and copolymers having at least 80 molar %, preferably at least 90 molar %, of recurring units of the formula (I).

Formula (I)

$$—NH—Ar_1—NHCO—Ar_2—CO—\qquad(I)$$

In the formula (I), $Ar_1$ and $Ar_2$ respectively and independently from each other represent a divalent aromatic group, preferably selected from those of the formulae:

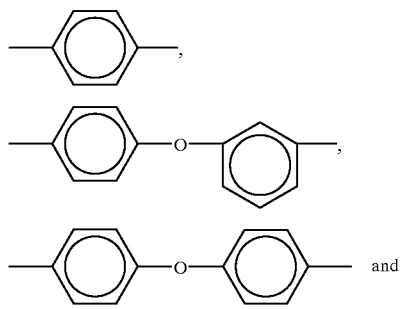

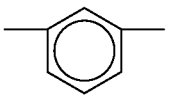

-continued

The above-indicated aromatic groups may be substituted by 1 to 4 substituents selected from, for example, halogen atoms, lower alkyl groups preferably having 1 to 4 carbon atoms and a phenyl group.

In the production of the aromatic polyamide fibers of the present invention having the specific crystal size properties (1), (2) and (3), the aromatic polyamide resin having the recurring units of the formula (I) is formed into fibers and the fibers are passed through a high temperature atmosphere or are brought into contact with a high temperature heater to impart a thermal history thereto. Alternatively, other aromatic polyamide fibers produced by a conventional fiber-producing process are passed through or stored in a high temperature atmosphere, or are brought into contact with a high temperature heater to impart a thermal history to the fibers in an after treatment step.

The principle process for producing the above-mentioned aromatic polyamide fibers and the properties of the fibers are disclosed in, for example, UK Patent No. 1,501,948, U.S Pat. No. 3,733,964, U.S. Pat. No. 3,767,756, and U.S. Pat. No. 3,869,429, and Japanese Unexamined Patent Publications No. 49-100,322, No. 47-10,863, No. 58-144,152, and No. 4-65,513. In the patents and publications, p-type aromatic polyamide fibers are disclosed as heat-resistant fibers. In these p-type aromatic polyamide fibers, 50 molar % or more of the groups $Ar_1$ and $Ar_2$ are p-oriented aromatic groups. Particularly, the p-type aromatic polyamide fibers are poly (p-phenylene terephthalamide) staple fibers (available under the trademark of KEVLER, from Du Pont) and copoly (p-phenyllene/3,4'-oxydiphenylene terephthalamide) staple fibers (available under the trade mark of TECHNORA, made by TEIJIN). The latter aromatic copolyamide staple fibers have a low impurity ion content, thus exhibits an excellent electric insulation property and are preferably employed in practice.

The copoly (p-phenylene/3,4'-oxydiphenylene terephthalamide) fibers having cation-exchanging and non-ion-absorbing solid inorganic compound particles fixed to the peripheral surfaces of the fibers, exhibit a high mixed varnish-penetration property and an enhanced adhesion to the mixed varnish through the inorganic compound particles. Thus in the production of electric insulating material and laminates for electric circuit boards, the copolyamide fibers contribute to decreasing the deformation of the electric insulating material or the electric circuit board and to enhancing the electric insulating property and the thermal dimensional stability of the material or board at a high humidity.

The cation-exchanging, non-ion-absorbing inorganic compounds include inorganic compounds, for example, silica, alumina-magnesia, kaolin, acid clay, active clay, talc, bentonite and hydrated aluminum silicate (osmose) which are capable of exchanging cations and of absorbing non-ions.

When these inorganic compounds are fixed in the state of a solid on the peripheral surfaces of the fibers, the adhesive properties of the fiber surfaces are enhanced. The solid particles of the inorganic compounds preferably have a particle size of about 0.01 to 5.00 μm. To fix the solid inorganic compound particles to the fiber surfaces, for example, the particles are brought into contact with and pressed under pressure on the surfaces of the fibers which have been softened, to embed the solid particles into the surface portions of the softened fibers.

The specific aromatic polyamide fibers of the present invention having the specific crystal size features can be produced by applying a severe heat treatment which is not taught or suggested by conventional heat treatments to the fibers during the fiber-producing procedures, or by applying the severe heat treatment, as an after-treatment, to the fibers, or by producing the aromatic polyamide from a low moisture-absorbing material partially substituted with substituents, for example, halogen atoms.

When the aromatic polyamide fibers of the present invention are employed for an electric insulting material, the impurity ions such as extracted sodium ions, extracted potassium ions and extracted chlorine ions, contained in the inside of the fibers may cause a problem of a decreased insulation. Therefore, during the fiber-producing procedures or during the fiber-after treatment procedures, the fibers are fully washed to such an extent that preferably the following requirements (1), (2) and (3) are satisfied, more preferably the following requirements (4), (5) and (6) are satisfied.

(1) Extracted sodium ion content $\leqq 40$ mg/liter
(2) Extracted potassium ion content $\leqq 3.0$ mg/liter
(3) Extracted chloride ion content $\leqq 7.5$ mg/liter
(4) Extracted sodium ion content $\leqq 35$ mg/liter
(5) Extracted potassium ion content $\leqq 2.5$ mg/liter
(6) Extracted chloride ion content $\leqq 6.5$ mg/liter When the requirements (1), (2) and/or (3) are not satisfied, the resultant aromatic polyamide fibers may exhibit an unsatisfactory electric insulating property and thus may not be usable for an electric insulting material.

The m-type aromatic polyamide staple fibers usable for the present invention include staple fibers comprising at least one member selected from homopolymers and copolymers comprising the recurring units of the formula (I) wherein 50 to 100 molar % of $Ar_1$ and $Ar_2$ are meta-type divalent aromatic groups. For example, in the m-type aromatic polyamides, the dicarboxylic acid component comprises at least one member selected from terephilalic acid and isophthalic acid and the diamine component comprises at least one member selected from m-phenylenediamine, 4,4'-diaminophenylether, 4,4'-diaminodiphenylmethane, and xylylenediamine. Typical m-type aromatic polyamides include poly-m-phenyleneisophthalamide, poly-m-xylyleneterephthalamide and copolyamides of isophthalic acid chloride and/or terephthalic acid chloride with metaphenylenediamine.

Generally, the m-type aromatic polyamide fibers exhibit a higher equilibrium moisture content (water content) and a higher impurity ion content than those of the p-type aromatic polyamide fibers and thus cause the fiber-reinforced resin materials to exhibit a reduced electric insulating property, particularly at a high humidity. Therefore, when the fiber-reinforced resin material is used for base materials of electric insulating materials or for laminate materials for electric circuit boards, the m-type aromatic polyamide fibers should be fully washed to reduce the impurity ion content or should have a more severe heat history than that of the p-type aromatic polyamide fibers.

The p-type aromatic polyamide fibers usable for the present invention, having an ultimate elongation of 6% or more and capable of easily deforming, can be produced by controlling the fiber production conditions.

For example, in the production procedure of copoly(p-phenylene/3,4'-oxydiphenylene terephthalamide) fibers, the draw ratio is controlled to a low level to prevent or restrict the promotion of crystallization, or the heat history is restricted. By these controls, the resultant p-type aromatic polyamide fibers of the present invention can exhibit unique properties definitely different from those of the conventional copoly(p-phenylene/3,4'-oxydiphenylene terephthalamide) fibers, namely a tensile strength of 10 g/d or less, an ultimate elongation of 6% or more and can be easily softened, deformed and melted at a relatively low temperature, although the chemical structure of the p-type aromatic polyamide fibers of the present invention is the same as that of the conventional p-type aromatic polyamide fibers. In this case, when the cation-exchanging and non-ion-absorbing inorganic compound is fixed in the state of a solid onto the peripheral surfaces of the fibers, the resultant inorganic compound particles exhibit an enhanced mixed varnish-penetration property, and the fibers can be firmly adhered to the mixed varnish through the fixed inorganic compound particles layer. Thus, in the production of the electric insulating materials or laminate materials for electric circuit boards, the deformation of the target materials can be reduced, and the electric insulating property and thermal dimensional stability of the target material can be enhanced.

Further, the p-type aromatic polyamide fibers of the present invention, having the high elongating property, exhibit reduced impurity ion content and moisture content in comparison with those of the m-type aromatic polyamide fibers. Therefore, the p-type aromatic polyamide fibers of the present invention are useful as a material for base materials of electric insulating materials and laminate materials for electric circuit boards which need a high electric insulating property, particularly a high reliability in the electric insulating property at a high humidity.

The organic resinous binder usable for the present invention preferably comprises at least one thermosetting resin selected from, for example, epoxy resins, phenol-formaldehyde resins, polyurethane resins and melamine-formaldehyde resins. Among these resins, the epoxy resins which have at least one functional epoxy group per molecule thereof and are dispersible in water have a high compatibility with the mixed varnish which is impregnated in the resin during the production of a pre-preg.

The fibrids usable for the present invention and comprising an organic polymer material include all the fine and short fibers and flakes having an equilibrium moisture content of 8.0% or less, exhibiting a binding property for the sheet-forming fibers during a wet fiber-sheet forming procedure and in the form of thin flakes, fine scales or randomly fibrillated fine and short fibers. The fibrids are selected from, for example, fibrids produced, in accordance with the methods disclosed in Japanese Examined Patent Publications No. 35-11,851 and No. 37-5,732, by mixing a solution of an organic polymer with a precipitating agent for the organic polymer while applying a shearing force to the mixture system, and another fibrids produced, in accordance with the method as disclosed in Japanese Examined Patent Publication No. 59-603, by randomly fibrillating a shaped article produced from a polymer solution exhibiting an optical anisotropy and having a high molecular orientation, with a mechanical shearing force, for example, a beating force. Among these fibrids, the former fibrids are preferably employed for the present invention.

The organic polymers usable for the binding fibrids are not limited the specific type of polymers as long as the polymers have a fiber or film-forming property and exhibit a thermal decomposition-starting temperature of 300° C. or more.

For example, the polymers for the binder fibrids may be selected from wholly aromatic polyesters having a liquid crystalline property when melted, and aromatic polymers having at least one heterocyclic structure. Among these polymers, copoly(p-phenylene/3,4'-oxydiphenylene terephthalamide (available under the trademark of TECHNORA, from TEIJIN) having a low impurity ion content, wholly aromatic polyesters (available under the trademark of VECTRAN, from KURARAY) which comprise, as acid components, p-hydroxybenzoic acid and 2,6-hydroxynaphthoic acid and exhibit a liquid crystalline property when melted, and a low equilibrium moisture content. When a high heat resistance is needed, poly-p-phenylene benzoxazole <PBO, made by TOYOBO> is advantageously used.

In the heat resistant wholly aromatic polyamide fiber sheet of the present invention, the content of the binder comprising at least one member selected from the organic resinous binders and the organic polymer fibrids is preferably 4 to 40% by weight, more preferably 5 to 30% by weight, based on the total weight of the sheet. When the content of the binder fibrids is controlled to a relatively low level, for example, the fibrids produced by the fibrid-producing method disclosed in Japanese Examined Patent Publications No. 35-11,851 and No. 37-5,732, are advantageously employed. Also, where the content of the binder fibrids is adjusted to a relatively high level, the fibrids produced by the method disclosed in, for example, Japanese Patent Publication No. 59-603 are advantageously employed. The fibrids produced in accordance with the methods of the above-mentioned Japanese publications may be employed together.

When the content of the binder fibrids is less than 4% by weight, the resultant aromatic polyamide fiber sheet produced by a wet paper-forming method may not exhibit a tensile strength sufficient to forming the fiber sheet. Also, when the content of the binder fibrids is more than 40% by weight, the resultant aromatic polyamide fiber sheet may exhibit too high a bulk density and may hinder the penetration of a mixed varnish into the sheet. The organic polymer fibrids include fibrids which shrink when moisture is removed therefrom, and other fibrids which elongate when moisture is removed therefrom.

When both the shrinking fibrids and the elongating fibrids are employed in combination with each other in an appropriate combining ratio, the resultant heat-resistant aromatic polyamide fiber sheet exhibits an enhanced dimensional stability, even when water-washing and drying are repeatedly applied to the sheet, a high thermal dimensional stability and a high wet dimensional stability. Therefore, two different types of fibrids may be used for the aromatic polyamide fiber sheet.

The aromatic polyamide fibers of the present invention have a large crystal sizes in the (110) and (200) planes. Namely, in the fibers, crystallization of the aromatic polyamide is proceeded to a large extent and the content of amorphous portions is reduced. Thus, even in the atmosphere in which a high temperature and a low temperature are repeatedly generated, the aromatic polyamide fibers of the present invention exhibit a small dimensional change both in the fiber axis direction and the transverse direction at right angles to the fiber axis direction. Also, the dimensional change of the aromatic polyamide fibers of the present invention due to the repeated moisture-absorption and desorption in the fiber axis and transverse directions is very small.

Also, the aromatic polyamide fibers of the present invention satisfying the crystal size requirements (1), (2) and (3) exhibit a specifically low thermal linear expansion coefficient within the range of minus values, namely from $-1.0 \times 10^{-6}/°$ C. to $-7.5 \times 10^{-6}/°$ C., and thus are appropriate as reinforcing fibers for resins having a positive thermal linear expansion coefficient and enable the thermal linear expansion coefficient of the fiber reinforced resin material to unlimitedly approach zero.

The aromatic polyamide fibers of the present invention satisfying the crystal size requirements (1), (2) and (3) exhibit a low equilibrium moisture content of 3.2% or less, particularly, when the crystal sizes (A) and (B) are within specific ranges 2.7% or less, more particularly 2.0% or less, and thus are definitely distinguished from the conventional aromatic polyamide fibers which generally have an equilibrium moisture content of 4.5% or more. Therefore, no peeling occurs at interfaces between the resin and the reinforcing aromatic polyamide fibers of the present invention.

The aromatic polyamide fiber sheet formed from the aromatic polyamide fibers of the present invention exhibit, even when an organic resinous binder having a relatively high impurity ion content is employed, an extracted sodium ion content of 75 mg/liter or less, an extracted potassium ion content of 35 mg/liter or less and an extracted chlorine ion content of 95 mg/liter. When the crystal sizes (A) and (B) are optimized and the fiber sheet are fully washed, the impurity ion contents of the aromatic polyamide fiber sheet can be decreased to the levels of: 60 mg/liter or less of the extracted sodium ion content, 20 mg/liter or less of the extracted potassium ion content and 80 ml/liter or less of the extracted chlorine ion content.

Further, when the p-type aromatic polyamide fibers of the present invention having a high ultimate elongation and capable of being easily deformed are used under optimum conditions, the extracted impurity ion contents can be decreased to the levels of: 50 mg/liter or less of the extracted sodium ion content, 17 mg/liter or less of the extracted potassium ion content and 0.5 mg/liter or less of the extracted chlorine ion content. Also, the aromatic polyamide fiber sheet of the present invention has a low moisture absorption and thus even when an electric current is applied to the sheet at a high humidity, no movement of the impurity ions occurs.

When the aromatic polyamide fibers are cut, the occurrence of the fibril-formation at the cut face and the unsatisfactory cutting is greatly influenced by the apparent crystal sizes (A) and (B) of the aromatic polyamide fibers. Namely, when the apparent crystal sizes (A) and (B) are too small, while the fibril-formation at the cut faces is restricted, the resultant fibers exhibit a decreased rigidity and can be easily deformed. Therefore, when a cutting force is applied with a cutting edge to the fibers, the fibers can easily escape from the cutting edge, and thus the cutting property of the fibers decreases. Also, when the crystal sizes (A) and (B) are too large, the cutting property of the resultant aromatic polyamide fibers increases. However, the fibers exhibit a reduced resistance to finely dividing of the cut face portions along the longitudinal axes of the fibers, and thus form fine fibrils projecting from the cut faces of the fibers. Therefore, the fibers have a reduced shaving property and perforating property.

In the aromatic polyamide fibers of the present invention, the apparent crystal sizes (A) and (B) are controlled to appropriate ranges. Therefore, when a resin composite laminate plate reinforced by the aromatic polyamide fibers of the present invention is subjected to a drill perforation work, the reinforcing fibers can be smoothly cut without fibril-formation on the cut faces and without occurrence of unsatisfactory cutting. Therefore, the inside wall faces of the resultant holes are smooth and not rough. Also, the carbon dioxide gas laser-perforation work can be advantageously applied to the resinous materials reinforced by the aromatic polyamide fibers of the present invention to obtain smooth holes.

EXAMPLES

The present invention will be further illustrated by the following examples.

In the examples and comparative examples, the following tests were applied to the resultant products.

(1) Apparent crystal size

Crystal size (A) in a (110) plane and crystal size (B) in a (200) plane of the aromatic polyamide fibers were determined by preparing a wide angle X-ray diffraction intensity curve of the fibers; then separating Ganssian distribution combined with Cancy distribution shown in the X-ray diffraction intensity curve from each other, in accordance with the method of Hindeleh et al. (A.M.H in deleh and D. J. Johns, Polymer, 19, 27 (1978); and from the obtained half width, calculating the apparent crystal sizes (A) and (B) in the (110) and (200) planes in accordance with the Sherrer's equation shown below.

Apparent crystal size=$K\lambda/(\beta \cos \theta)$ wherein K represents a constant numeral of 0.94, $\lambda$ represents a wavelength of x-rays of 0.154 nm (1.54 angstroms), $\beta$ represents the half value width in radian units of the reflection profile, calculated from the equation:

$\beta^2 = \beta_M^2 - \beta_B^2$ wherein $\beta_M$ represents as measured value and $\beta_E$ represents a constant for the measurement apparatus used, and $\theta$ represents a bragg angle.

(2) Thermal linear expansion coefficient

The fibers having an initial fiber length of 200 mm between a pair of fiber-holding clips were repeatedly heated and cooled between room temperature and 250° C. at a heating and cooling rate of 10° C./minute, by using a thermal analysis apparatus (TMA, thermoflex type, made by RIGAKU DENKI K.K.) and the thermal linear expansion coefficient of the fibers was calculated from dimensional changes of the fibers at a temperature of 100 to 200° C.

(3) Specific gravity

The specific gravity of the fibers was determined by a density gradient tube method in n-heptane/tetrachloromethane at a temperature of 25° C.

(4) Equilibrium moisture content

The equilibrium moisture contents of the fibers and the fiber sheet were determined in accordance with JIS L 1013, by the following methods.

(A) Equilibrium moisture content of fibers

Aromatic polyamide fibers were absolutely dried in the ambient air atmosphere at a temperature of 120° C., left to stand at a temperature of 20° C. at a relative humidity (RH) of 65% for 72 hours to moisture-condition the fibers, and then subjected to a measurement of moisture content of the fibers. The moisture content of the fibers was indicated by percentage (%) of the weight of water contained in the moisture-conditioned fibers based on the absolute dry weight of the fibers.

When the fibers subjected to the moisture content test consisted of a mixture of two or more different types of fibers, the moisture contents (%) of the individual types of fibers were separately determined, and a weight average moisture content of the mixed fibers was calculated from the moisture contents of the individual types of fibers and the weight proportions of the individual types of fibers based on the total weight of the mixed fibers, and indicated in %.

(B) Equilibrium moisture content of fiber sheet

A fiber sheet produced by a paper-forming method was absolutely dried at a temperature of 120° C. and moisture-conditioned at a temperature of 20° C. at a relative humidity (RH) of 65% for 72 hours. Then, the moisture-conditioned fiber sheet was subjected to a moisture content measurement, and the moisture content of the fiber sheet was indicated by percentage (%) of the weight of water contained in the moisture-conditioned fiber sheet based on the absolute dry weight of the fiber sheet.

(5) Surface electric resistivity of fibers

With reference to the surface electric resistivity test method in accordance with Japanese Industrial Standard (JIS) C 6480, electrodes were formed by using a silver paste on a fiber with intervals of 20 mm in the longitudinal direction of the fiber, and an electric resistivity between the electrodes was measured. The surface electric resistivity of the fiber was represented by the measured electric resistivity between the electrodes.

Before the test, the fiber was moisture-conditioned at a temperature of 20° C. at a relative humidity (RH) of 40% for 24 hours and the surface electric resistivity measurement was carried out at a temperature of 20° C. at a relative humidity (RH) of 40%.

(6) Amounts of extracted impurity ions

Fibers were cut short, immersed in 50 ml of distilled water and heat-treated in an autoclave at a temperature of 121° C. under a pressure of 2 kg/cm$^2$G for 24 hours. The amounts of the extracted individual types of impurity ions in the distilled water were determined by an ICP analysis and an ion-chromatographic analysis. The amounts of the individual types of impurity ions were indicated in mg per liter of the extracting distilled water.

(7) Bulk density of fiber sheet

The bulk density of each staple fiber sheet was determined in accordance with Japanese Industrial Standard (JIS) C 2111, Section 6.1.

(8) Tensile strength of fiber sheet (A) Tensile strength and ultimate elongation of fibers The tensile strength and ultimate elongation of fibers were tested in accordance with JIS L 1013, Section 7 by using a constant stretching rate type tensile tester.

(B) Tensile strength of fiber sheet

The tensile strength of a fiber sheet was tested in accordance with JIS C 2111, Section 7, by using a constant stretching rate type tensile tester.

(9) Interlaminar peeling strength of fiber sheet

In the determination of the interlaminar peeling strength of a fiber sheet, a sample of the fiber sheet having a length of 200 mm and a width of 15 mm was peel-divided at the middle layer portion thereof at a peeling angle of 180 degrees into two pieces, by a T-peeling method using a constant stretching rate type tensile tester. A stress created on the sample was measured.

(10) Thermal dimensional change of fiber sheet

A fiber sheet having a length of 300 mm and a width of 50 mm was subjected to a measurement of the longitudinal length of the sheet before and after a heat treatment at a temperature of 280° C. for 5 minutes, by using a high accuracy two dimensional coordinate-measurement tester (made by Muto Kogyo K.K.). The change (%) in the longitudinal length was calculated in accordance with the following equation:

$Dn(\%)=(Lb-La)/La \times 100$ wherein Dn represents a thermal dimensional change in percent in the longitudinal length of the fiber sheet between before and after the heat treatment, Lb represents a longitudinal length of the fiber sheet after the heat treatment and La represents a longitudinal length of the sheet before the heat treatment.

(11) Dimensional change of fiber sheet due to moisture absorption and desorption thereof A sample of a fiber sheet was left to stand in an atmosphere at room temperature at a relative humidity (RH) of 85% or more for 120 hours or more to allow the sample to fully absorb moisture therein. The sample having a width of 5 mm was held at two end portions thereof by a pair of holders of a thermal analyzer (trademark: Thermoflex type thermal analyzer TMA, made by Rigaku Denki K.K.). The initial distance between the holder was 200 mm. The sample was heated in the thermal analyzer from room temperature to 280° C. at a heating rate of 10° C./minute and then cooled to room temperature at a cooling rate of 10° C./minute. The heating and cooling procedures were repeated further twice or more (three times or more in total), while recording a dimensional change of the length of the sample on a chart. The initial length of the sample after the moisture-conditioning step and before the first heating step was compared with the length of the sample after the second or later cooling step was completed. The maximum difference between the length of the sample after the moisture-conditioning step and before the first heating step and the length of the sample after the second or later cooling step was calculated, and then the percentage of the maximum length difference (maximum elongation or maximum shrinkage), based on the sample length after the moisture-conditioning step and before the first heating step was calculated. The lower the length change, the higher the thermal dimensional stability and deformation resistance of the sample in the temperature- and moisture content-varying conditions.

(12) Production of laminate for electric circuit board and evaluation of cutting processability thereof A varnish composition was prepared by preparing a mixture of a high-purity brominated bisphenol A-type epoxy resin with an o-cresol novolak type epoxy resin, a curing agent consisting of dicyandiamide and a curing-promoting agent consisting of 2-ethyl-4-methyl-imidazole and dissolving the resultant mixture in a mixed solvent consisting of methylethylketone and methyl cellosolve in a mixing ratio of 50/50 by weight. A sample of a fiber sheet was impregnated with the varnish composition, and then the impregnated varnish composition was dried at a temperature of 100 to 120° C. for 5 to 10 minutes, to provide a B stage pre-preg sheet having a varnish resin content of 55% by volume.

Two pieces of the pre-preg sheet were laminated on both the front and back surfaces of a first copper foil having a thickness of 35 µm, and then, both the front and back surfaces of the resultant laminate was further laminated with two pieces of a second copper foil having the same thickness as that of the first copper foil. The resultant laminate was heat-pressed in a reduced pressure atmosphere at a temperature of 170° C. under a pressure of 40 kg/cm² for 50 minutes, and then cured in a hot air dryer at a temperature of 200° C. for about 20 minuets. A cured laminate for an electric circuit board was obtained.

The electric circuit board laminate was perforated at five points thereof by a high speed-revolving drill having an outer diameter of 0.5 mm at a revolving rate of 70,000 turns/minute, and an electron microscopic photograph of upper portions of the inside wall surfaces of the resultant five cylindrical holes was taken. The cut surface conditions of the holes were observed and evaluated into the following three classes.

| Class | Cutting processability |
|---|---|
| 3 | Best cutting processability The inner wall surface of the hole has no fine fibrils and is quite smooth. |
| 2 | Satisfactory cutting processability The inner wall surface of the hole has a small number of fine fibrils which do not cause any problem in practice. |
| 1 | Bad The inner wall surface of the hole has a large number of fine fibrils and is not smooth. |

(13) Deformation of a laminate for electric circuit board

The same pre-preg sheets as that used in test (12) was laminated on both the front and back surfaces of a first copper foil having a thickness of 18 µm and then second copper foils having a thickness of 35 µm were laminated on the pre-preg sheet layers. The resultant laminate was heat-pressed by a hot press. The resultant laminate was cut into square pieces having length and width of 15 mm; and then central square portions of the second copper foils of the square pieces having a length and width of 110 mm were removed, so as to retain edge portions of the second copper foils in a square frame form having a width of 20 mm, by means of etching, to prepare specimens for the test. The resultant partially etched laminate pieces were heat-treated at a temperature of 260° C. for 10 minutes. When the specimens were deformed, due to the heat treatment, the maximum deformation of the specimens were measured as a difference in the level between the deformed portions and the central portions of the specimens. The deformation include warping, distortion, torsion, and corrugation.

(14) Insulation resistance at a high humidity

The same laminate for electric circuit board before drilling as that in the test (12) was used. One surface of the laminate was partially etched to form comb-shaped electrodes at intervals of 0.15 mm and consisting of the second copper foil. The resultant specimen was stored for 1,000 hours while applying a direct voltage of 35 V to the electrodes at a temperature of 60° C. at a relative humidity (RH) of 95%, and then in the atmosphere at a temperature of 20° C. at a relative humidity (RH) of 6% for one hour. After the storage, a direct voltage of 35 to 90 volts was applied to the electrodes for 60 seconds, to measure the insulation resistance of the specimen

Example 1

Poly-p-phenylene terephthalamide fibers having an individual fiber thickness of 1.67 d tex (1.50 denier), a specific gravity of 1.442, an equilibrium moisture content of about 7.0%, an apparent crystal size at a (110) plane of 5.5 nm (55 angstroms) and an apparent crystal size at a (200) plane of 6.2 nm (62 angstroms) were suspended in flowing distilled water and stirred at a low-stirring rate for about one day to fully wash the fibers, and to decrease the impurity ion content of the fibers. Then the washed fibers were dried and successively heat-treated in a high temperate atmosphere at a temperature of 280° C. for one minute.

The resultant aromatic polyamide fibers were subjected to a measurement of the apparent crystal sizes (A) and (B) in the (110) plane and the (200) plane. In the results of the measurement, the apparent crystal size (A) in the (110) plane of the fibers was 8.0 nm (80 angstroms), crystal size (B) in the (200) plane of the fibers was 8.3 nm (83 angstroms), the product (A×B) was 66.40. The properties of the fibers tested by the above-mentioned test methods are shown in Table 1.

Comparative Example 1

The same procedures as in Example 1 were carried out, except that the washing in the flowing water and heat-treatment of the aromatic polyamide fibers were omitted.

The resultant aromatic polyamide fibers had an apparent crystal size (A) in the (110) plane of 3.5 nm (55 angstroms) and an apparent crystal size (B) in the (200) plane of 6.2 nm (62 angstroms) and a product (A×B) was 34.10. The properties of the fibers are shown in Table 1.

Example 2

The same procedure as in Example 1 were carried out, except that the heat-treatment was applied at a temperature of 325° C. to the fibers.

The resultant aromatic polyamide fibers had an apparent crystal size (A) in the (110) plane of 10.2 nm (102 angstroms) and an apparent crystal size (B) in the (200) plane of 8.6 nm (86 angstroms) and a product (A×B) was 87.72. The properties of the fibers are shown in Table 1.

Example 3

Poly-p-phenylene terephthalamide fibers having an individual fiber thickness of 1.58 d tex (1.42 denier), a specific gravity of 1.455, an equilibrium moisture content of about 4.5%, an apparent crystal size at a (110) plane of 7.2 nm (72 angstroms) and an apparent crystal size at a (200 plane) of 8.5 nm (85 angstroms) were washed in the same manner as in Example 1 to fully wash the fibers, and to decrease the impurity ion content of the fibers. Then the washed fibers were dried and successively heat-treated in a high temperature atmosphere at a temperature of 400° C. for one minute.

The resultant aromatic polyamide fibers were subjected to a measurement of the crystal sizes (A) and (B) in the (110) plane and the (200) plane. In the results of the measurement, the apparent crystal size (A) in the (110) plane of the fibers was 15.4 nm (154 angstroms), the apparent crystal size (B) in the (200) plane of the fibers was 12.2 nm (122 angstroms), the product (A×B) was 187.88. The properties of the fibers tested by the above-mentioned test methods are shown in Table 1.

Example 4

The same procedures as in Example 3 were carried out, except that the heat-treatment was applied at a temperature of 450° C. to the fibers.

The resultant aromatic polyamide fibers had an apparent crystal size (A) in the (110) plane of 17.0 nm (170 angstroms) and an apparent crystal size (B) in the (200) plane of 14.5 nm (145 angstroms) and a product (A×B) was 246.50. The properties of the fibers are shown in Table 1.

Comparative Example 2

The same procedure as in Example 3 were carried out, except that the heat-treatment was applied at a temperature of 550° C. to the fibers.

The resultant aromatic polyamide fibers had an apparent crystal size (A) in the (110) plane of 28.5 nm (285 angstroms) and an apparent crystal size (B) in the (200) plane of 22.2 nm (222 angstroms) and a product (A×B) was 632.70. The properties of the fibers are shown in Table 1.

The resultant fibers were thermally oxidized on the surface portions thereof, colored into a brown color, exhibited a low surface electric resistivity of $3 \times 10^{-8}$ Ω/cm and thus were useless as an electric insulating material in practice.

Example 5

The same procedures as in Example 3 were carried out, except that after the impurity ion content of the fibers was decreased by washing the fibers with an industrial flowing water while immersing the fibers in the water, the washed fibers were brought into contact with a super high temperature heater at a temperature of 550° C. under tension for 0.6 second, while forwarding on the heater to heat-treat the fibers.

The resultant aromatic polyamide fibers had an apparent crystal size (A) in the (110) plane of 10.7 nm (107 angstroms) and an apparent crystal size (B) in the (200) plane of 9.2 nm (92 angstroms) and a product (A×B) was 98.44. The properties of the fibers are shown in Table 1.

Example 6

The same procedures as in Example 3 were carried out, except that after the impurity ion content of the fibers were decreased by immersing the fibers in an industrial flowing water and washing the fibers with the flowing water, the washed fibers were brought into contact with a super high temperature of 550° C. under tension for 0.5 second while forwarding the fibers along the heater, to heat-treat the fibers.

The resultant aromatic polyamide fibers had an apparent crystal size (A) in the (110) plane of 28.0 nm (280 angstroms), an apparent crystal size (B) in the (200) plane of 22.4 nm (224 angstroms) and a product (A×B) was 627.20.

The physical properties of the aromatic polyamide fibers are shown in Table 1.

Example 7

The same procedures as in Example 6 were carried out, except that the temperature of the heater was changed to 600° C., the contact time of the fibers with the heater was changed to 0.6 second.

The resultant aromatic polyamide fibers had an apparent crystal size (A) in the (110) plane of 27.5 nm (275 angstroms), an apparent crystal size (B) in the (200) plane of 20.8 nm (208 angstroms) and a product (A×B) of 572.00.

The physical properties of the aromatic polyamide fibers are shown in Table 1.

Comparative Example 3

The same procedures as in Example 6 were carried out, except that the temperature of the heater was changed to 650° C. and the contact time of the fibers with the heater was changed to 0.9 second.

The resultant aromatic polyamide fibers had an apparent crystal size (A) in the (110) plane of 28.2 nm (282 angstroms), an apparent crystal size (B) in the (200) plane of 22.5 nm (225 angstroms) and a product (A×B) was 634.50.

The physical properties of the aromatic polyamide fibers are shown in Table 1. In the resultant fibers, the surface portions of the fibers were heat-oxidized and colored brown. The resultant fibers had a low surface electric resistivity of $2 \times 10^{-9}$ Ω/cm and thus are suitable as an electric insulating material in practice.

Then the dried staple fiber web was heat-tested by using a calender machine with a pair of metal rolls having hardened surfaces and a diameter of about 350 mm, at a temperature of 200° C. under a linear pressure of 160 kg/cm, then further heat pressed by using a high temperature high calendering machine with a pair of metal rolls having hardened surfaces and a diameter of about 400 mm, at a temperature of 320° C. under a linear pressure of 200 kg/cm, to soften and/or melt the copoly(p-phenylene/3,4'-oxydiphenylene terephthalamide) fibrids and to firmly bond the poly-p-phenylene terephthalamide staple fibers to each other through the softened and/or molten fibrids. An aromatic polyamide fiber sheet having a basis weight of 72 g/m² was obtained.

The resultant aromatic polyamide fiber sheet had an equilibrium moisture content of 1.73%. The sheet-production conditions of the fiber sheet are shown in Table 2 and the properties of the fiber sheet determined by the above-mentioned tests are shown in Table 3.

Also, a pre-preg was produced from the fiber sheet and a laminate for an electric circuit board was produced from the pre-preg, by the method as shown in the test (12)

The laminated was tested by the tests 12, 13 and 14. The test results are shown in Table 3.

TABLE 1

| | | Principal properties of fibers | | | | | | | | |
|---|---|---|---|---|---|---|---|---|---|---|
| | | Crystal size | | | | Thermal linear | Equilibrium | Surface | Impurity ion content | | |
| Item Example No. | | (110) plane (nm) | (200) plane (nm) | Product A × B | Specific gravity | expansion coefficient (×10⁻⁶/° C.) | moisture content (%) | resistivity (Ω/cm) | Sodium ions (mg/l) | Potassium ions (mg/l) | Chloride ions (mg/l) |
| Example | 1 | 8.0 | 8.3 | 66.40 | 1.449 | −4.1 | 3.1 | $10^{12}$ | 15.2 | 1.2 | 2.2 |
| | 2 | 10.2 | 8.6 | 87.72 | 1.462 | −3.9 | 2.6 | $10^{13}$ | 14.5 | 0.9 | 1.9 |
| | 3 | 15.4 | 12.2 | 187.88 | 1.464 | −4.1 | 1.7 | $10^{14}$ | 10.0 | 0.4 | 2.7 |
| | 4 | 17.0 | 14.5 | 246.50 | 1.466 | −3.7 | 1.6 | $10^{14}$ | 10.3 | 0.4 | 2.5 |
| | 5 | 10.7 | 9.2 | 98.44 | 1.468 | −4.0 | 1.9 | $10^{14}$ | 20.3 | 1.3 | 2.4 |
| | 6 | 28.0 | 22.4 | 627.20 | 1.477 | −2.5 | 1.4 | $10^{12}$ | 16.6 | 0.6 | 4.4 |
| | 7 | 27.5 | 20.8 | 572.00 | 1.472 | −2.8 | 1.6 | $10^{13}$ | 17.5 | 0.6 | 4.9 |
| Comparative Example | 1 | 5.5 | 6.2 | 34.10 | 1.422 | −4.3 | 6.9 | $10^{11}$ | 52.1 | 1.5 | 4.8 |
| | 2 | 28.5 | 22.2 | 632.70 | 1.475 | −2.4 | 1.4 | $10^{8}$ | 9.8 | 0.4 | 4.3 |
| | 3 | 28.2 | 22.5 | 634.50 | 1.478 | −2.2 | 1.4 | $10^{9}$ | 17.5 | 0.7 | 6.1 |

Example 8

A staple fiber blend comprising 94% by weight of the same aromatic polyamide (poly-p-phenylene terephthalamide) fibers as in Example 4 having a fiber length of 3 mm, an equilibrium moisture content of 1.6% and 6% by weight of fibrids comprising a copoly(p-phenylene/3,4'-oxydiphenylene terephthalamide), made by TEIJIN and an equilibrium moisture content of 4.1% were suspended in water by using a pulper and mixed with 0.02% by weight of a dispersing agent (Trademark: YM-80, made by MATSUMOTO YUSHI K.K., to provide an aqueous slurry having a staple fiber-fibrid total content of 0.15% by weight, for a sheet-forming procedure.

The aqueous staple fiber slurry was subjected to a paper-forming procedure using a TAPPI hand paper-forming machine, the resultant wet staple fiber web was lightly dewatered under pressure, the dewatered wet staple fiber web was dried in a hot air drier at a temperature of 150° C. for 15 minutes. A heat-resistant fiber sheet was obtained.

Comparative Example 4

An aromatic polyamide fiber sheet was produced by the same procedures as in Example 8, except that the fiber blend comprised 98% by weight of the aromatic polyamide staple fibers and 2% by weight of copoly(p-phenylene/3,4'-oxydiphenylene terephthalate) fibrids.

The production conditions of the fiber sheet is shown in Table 2, and the properties of the fiber sheet tested by the above-mentioned tests are shown in Table 3. The properties of the laminate for electric circuit boards produced from the fiber sheet was tested by the tests (12), (13) and (14). The test results are shown in Table 3.

Examples 9 to 13 and Comparative Examples 5 and 6

In each of Examples 9 to 13 and Comparative Examples 5 and 6, an aromatic polyamide fiber sheet was produced by the same procedures as in Example 8, except that the fiber sheet was prepared from a staple fiber blend comprising (1)

the same aromatic polyamide staple fibers as in Example 4, having a fiber length of 3 mm and an equilibrium moisture content of 1.6%; (2) aromatic polyamide staple fibers comprising a copoly(p-phenylene/3,4'-oxydiphenylene terephthalamide, surface-coated with 0.5% by weight of talc and 0.1% by weight of osmose and having an individual fiber thickness of 1.67 d tex (1.50 denier), a fiber length of 3 mm and an equilibrium moisture content of 1.8% which fibers are available under a trademark of TECHNORA from TEIJIN); and (3) heat-resistant organic polymer fibrids (made by TEIJIN) comprising a copoly(p-phenylene/3,4'-oxydiphenylene terephthalamide) having an equilibrium moisture content of 4.1%, in the proportions as shown in Table 2. The staple fiber blend was suspended in water, and converted to a fiber sheet in the same method as in Example 8.

The production conditions of the fiber sheet are shown in Table 2 and the test results of the fiber sheet are shown in Table 3.

Also, a laminate for electric circuit boards was prepared from a pre-preg produced from the fiber sheet impregnated with the varnish composition. The results of the tests (12), (13) and (14) are shown in Table 3.

Comparative Example 7

An aromatic polyamide fiber sheet was produced by the same procedures as in Example 8, except that the same aromatic polyamide staple fibers as in Example 8 were used in an amount of 98% by weight, and the copoly(p-phenylene/3,4'-oxydiphenylene terephthamide) fibrids were replaced by 2% by weight of an epoxy resin binder which was employed in the state of an aqueous solution having a dry solid content of the binder of 10% by weight and applied by a spray method during the fiber sheet-forming procedure.

The production conditions of the fiber sheet are shown in Table 2 and the test results of the fiber sheet are shown in Table 3.

Also, the fiber sheet was converted to a pre-preg and then further to a laminate for electric circuit boards by the method shown in the test (12). The results of the tests (12), (13) and (14) applied to the laminate are shown in Table 3.

Examples 14 to 15 and Comparative Examples 8 and 9

An aromatic polyamide fiber sheet was produced by the same procedures as in Example 10, except that the same aromatic polyamide staple fibers as in Example 4, and copoly(p-phenylene/3,4'-oxydiphenylene terephthalamide staple fibers (trademark: TECHNORA, made by TEIJIN) having an individual fiber thickness of 1.67 d tex (1.50 denier), a fiber length of 3 mm, and an equilibrium moisture content of 1.8% and surface-content with 0.5% by weight of talc and 0.1% by weight of osmose, were blended in the blend proportions shown in Table 2.

Example 16

An aromatic polyamide fiber sheet was produced by the same procedures as in Example 10, except that the same aromatic polyamide staple fibers as in Example 2, having a fiber length of 3 mm and an equilibrium moisture content of 2.6% and copoly(p-phenylene/3,4'-oxydiphenylene terephthalamide staple fibers (trademark: TECHNORA, made by TEIJIN) having an individual fiber thickness of 1.67 d tex (1.50 denier), a fiber length of 3 mm, and an equilibrium moisture content of 1.8% and surface-coated with 0.5% by weight of talc and 0.1% by weight of osmose, were used.

The production conditions of the fiber sheet are shown in Table 2 and the test results of the fiber sheet are shown in Table 3.

The contents of the impurity ions contained in the fiber sheet were measured by the above-mentioned test (6). In the test results, the extracted sodium ion content was 38 mg/liter, the extracted potassium ion content was 3.8 mg/liter and the extracted chlorine ion content was 7.5 mg/liter. These impurity ion contents were satisfactory.

Also, the fiber sheet was converted to a pre-preg impregnated with the varnish composition and then further to a laminate for electric circuit boards by the method shown in the test (12). The results of the tests (12), (13) and (14) applied to the laminate are shown in Table 3.

Examples 17 to 23

In each of Examples 17 to 23, an aromatic polyamide fiber sheet was produced by the same procedures as in Example 10, except that the same aromatic polyamide staple fibers as in Example 4, having a fiber length of 3 mm and an equilibrium moisture content of 1.6%, copoly(p-phenylene/3,4'-oxydiphenylene terephthalamide staple fibers (trademark: TECHNORA, made by TEIJIN) having an individual fiber thickness of 1.67 d tex (1.50 denier), a fiber length of 3 mm and an equilibrium moisture content of 1.8% and surface-coated with 0.5% by weight of talc and 0.1% by weight of osmose, poly-m-phenylene isophthalamide staple fibers (trademark: CORNEX, made by TEIJIN) having an individual fiber thickness of 3.33 d tex (3.0 denier), and a fiber length of 5 mm, and copoly(p-phenylene/3,4'-oxydiphenylene terephthalamide fibrids (made by TEIJIN), which has a high heat resistance and an equilibrium moisture content of 4.1%, were mixed with each other in mixing proportions as shown in Table 2, and the mixed staple fibers and fibrids were suspended in water.

The production conditions of the fiber sheet are shown in Table 2 and the test results of the fiber sheet are shown in Table 3.

Also, the fiber sheet was converted to a pre-preg and then further to a laminate for electric circuit boards by the method shown in the test (12). The results of the tests (12), (13) and (14) applied to the laminate are shown in Table 3.

Examples 24 to 29

In each of Examples 24 to 29, an aromatic polyamide fiber sheet was produced by the same procedures as in Example 19, except that, the poly-m-phenylene isophthalamide staple fibers of Example 19 were replaced in Example 24 by poly-p-phenylene benzo-bisthiazole staple fibers; in Example 25 by wholly aromatic polyester staple fibers exhibiting a liquid crystalline property when melted; in Example 26 by polyphenylene sulfide staple/fibers; in Example 27 by polyetherimide staple fibers; in Example 28 by polyetheretherketone staple fibers; and in Example 29 by polytetrafluoroethylene staple fibers.

The production conditions of the fiber sheet are shown in Table 2 and the test results of the fiber sheet are shown in Table 3.

Also, the fiber sheet was converted to a pre-preg and then further to a laminate for electric circuit boards by the method shown in the test (12). The results of the tests (12), (13) and (14) applied to the laminate are shown in Table 3.

TABLE 2

| | | Mixing of component fibers (wt %) | | High calendering conditions | |
|---|---|---|---|---|---|
| | | Staple fibers A/B | Staple fibers C/D/E | Binder component fibrid/resin | (C. °) | (kg/cm) |
| Comparative Example | 4 | 98/0 | 0/0/0 | 2/0 | 320 | 200 |
| Example | 5 | 6/92 | 0/0/0 | 2/0 | 320 | 200 |
| Example | 8 | 94/0 | 0/0/0 | 6/0 | 320 | 200 |
| | 9 | 6/88 | 0/0/0 | 6/0 | 320 | 200 |
| | 10 | 15/75 | 0/0/0 | 10/0 | 320 | 200 |
| | 11 | 20/60 | 0/0/0 | 20/0 | 320 | 200 |
| | 12 | 20/45 | 0/0/0 | 35/0 | 320 | 200 |
| | 13 | 45/20 | 0/0/0 | 35/0 | 320 | 200 |
| Comparative Example | 6 | 15/35 | 0/0/0 | 50/0 | 320 | 200 |
| | 7 | 98/0 | 0/0/0 | 0/2 | 320 | 200 |
| | 8 | 6/92 | 0/0/0 | 0/2 | 320 | 200 |
| Example | 14 | 15/75 | 0/0/0 | 0/10 | 320 | 200 |
| | 15 | 20/45 | 0/0/0 | 0/35 | 320 | 200 |
| Comparative Example | 9 | 45/20 | 0/0/0 | 0/50 | 320 | 200 |
| Example | 16 | 15/75 | 0/0/0 | 10/0 | 320 | 200 |
| | 17 | 15/73 | 2/0/0 | 10/0 | 320 | 200 |
| | 18 | 15/70 | 5/0/0 | 10/0 | 320 | 200 |

TABLE 2-continued

| | | Mixing of component fibers (wt %) | | High calendering conditions | |
|---|---|---|---|---|---|
| | | Staple fibers A/B | Staple fibers C/D/E | Binder component fibrid/resin | (C. °) | (kg/cm) |
| | 19 | 15/60 | 15/0/0 | 10/0 | 320 | 200 |
| | 20 | 5/55 | 20/0/0 | 10/0 | 320 | 200 |
| | 21 | 5/70 | 15/0/0 | 10/0 | 320 | 200 |
| | 22 | 30/45 | 15/0/0 | 10/0 | 320 | 200 |
| | 23 | 55/20 | 15/0/0 | 10/0 | 320 | 200 |
| | 24 | 15/60 | 0/0/15 | 10/0 | 320 | 200 |
| | 25 | 15/60 | 0/0/15 | 10/0 | 320 | 200 |
| | 26 | 15/60 | 0/0/15 | 10/0 | 260 | 200 |
| | 27 | 15/60 | 0/0/15 | 10/0 | 260 | 200 |
| | 28 | 15/60 | 0/0/15 | 10/0 | 300 | 200 |
| | 29 | 15/60 | 0/0/15 | 10/0 | 300 | 200 |

[Note] Staple fiber A: Poly-p-phenylene terephthalamide staple fibers

Staple fiber B: Copoly(p-phenylene/3,4'-oxydiphenylene terephthalate staple fibers Staple fiber C: poly-m-phenylene isophthalamide staple fibers Staple fiber D: Copoly(p-phenylene/3,4'-oxydiphenylene terephthalamide staple fibers having an ultimate elongation of 8% or more Staple fiber E: Heat-resistant organic polymer staple fibers other than the above-mentioned staple fibers

TABLE 3

| | | Properties of heat resistant fiber sheet | | | | | Electric circuit board laminate | | |
|---|---|---|---|---|---|---|---|---|---|
| Item Example No. | | Bulk density (g/cm³) | Tensile strength (kg/15 mm) | Inter-laminar peeling strength (g/15 mm) | Thermal dimensional change (%) | Equilibrium moisture content (%) | Dimensional change due to moisture-absorption and desorption (μm) | Deformation (mm) | Cutting processability | Surface resistivity (Ω/cm) |
| Comparative Example | 4 | 0.29 | 1.1 | 9.6 | 0.09 | 1.68 | 16 | 1.2 | 3–2 | $10^9$ |
| Example | 5 | 0.35 | 1.3 | 10.2 | 0.12 | 1.85 | 39 | 1.9 | 3–2 | $10^9$ |
| Example | 8 | 0.66 | 3.4 | 29.5 | 0.02 | 1.73 | 12 | 0.8 | 2–3 | $10^{11}$ |
| | 9 | 0.68 | 3.8 | 43.2 | 0.02 | 1.91 | 14 | 0.9 | 2–3 | $10^{12}$ |
| | 10 | 0.70 | 5.8 | 44.8 | 0.01 | 1.94 | 9 | 0.6 | 3 | $10^{13}$ |
| | 11 | 0.77 | 6.9 | 56.3 | 0.04 | 2.06 | 21 | 1.0 | 3 | $10^{13}$ |
| | 12 | 0.82 | 8.1 | 62.4 | 0.06 | 2.24 | 25 | 1.4 | 3 | $10^{12}$ |
| | 13 | 0.80 | 6.2 | 57.8 | 0.03 | 2.19 | 16 | 0.9 | 2–3 | $10^{11}$ |
| Comparative Example | 6 | 0.91 | 10.2 | 81.1 | 0.18 | 2.51 | 55 | 2.2 | 2–3 | $10^8$ |
| | 7 | 0.21 | 0.8 | 7.5 | 0.24 | 1.71 | 21 | 2.6 | 1–2 | $10^9$ |
| | 8 | 0.29 | 1.1 | 9.2 | 0.36 | 1.89 | 44 | 3.5 | 1–2 | $10^9$ |
| Example | 14 | 0.42 | 2.2 | 17.8 | 0.15 | 2.22 | 43 | 1.8 | 2–3 | $10^{13}$ |
| | 15 | 0.67 | 5.2 | 64.6 | 0.22 | 2.68 | 35 | 2.6 | 2–3 | $10^{12}$ |
| Comparative Example | 9 | 0.77 | 6.7 | 66.8 | 0.29 | 3.21 | 31 | 2.8 | 2–3 | $10^8$ |
| Example | 16 | 0.64 | 4.1 | 38.8 | 0.03 | 2.10 | 22 | 0.9 | 2–3 | $10^{11}$ |
| | 17 | 0.72 | 6.1 | 45.7 | 0.02 | 2.02 | 10 | 0.8 | 2–3 | $10^{13}$ |
| | 18 | 0.73 | 6.3 | 46.2 | 0.03 | 2.14 | 7 | 0.9 | 3 | $10^{13}$ |
| | 19 | 0.75 | 6.6 | 47.1 | 0.05 | 2.45 | 5 | 0.7 | 3 | $10^{12}$ |
| | 20 | 0.78 | 7.1 | 50.2 | 0.08 | 2.62 | 8 | 1.4 | 3 | $10^{11}$ |
| | 21 | 0.67 | 4.5 | 31.7 | 0.02 | 2.46 | 16 | 0.7 | 3 | $10^{12}$ |
| | 22 | 0.57 | 4.3 | 33.6 | 0.01 | 2.50 | 10 | 0.6 | 3 | $10^{12}$ |
| | 23 | 0.49 | 4.7 | 41.2 | 0.00 | 2.35 | 3 | 0.4 | 3 | $10^{11}$ |
| | 24 | 0.69 | 4.8 | 32.9 | 0.02 | 1.66 | 4 | 0.9 | 3 | $10^{12}$ |

TABLE 3-continued

Properties of heat resistant fiber sheet

| Item Example No. | Bulk density (g/cm³) | Tensile strength (kg/15 mm) | Inter-laminar peeling strength (g/15 mm) | Thermal dimensional change (%) | Equilibrium moisture content (%) | Dimensional change due to moisture-absorption and desorption (μm) | Electric circuit board laminate | | |
|---|---|---|---|---|---|---|---|---|---|
| | | | | | | | Deformation (mm) | Cutting process-ability | Surface resistivity (Ω/cm) |
| 25 | 0.78 | 7.2 | 62.1 | 0.07 | 1.67 | 20 | 1.2 | 2–3 | $10^{12}$ |
| 26 | 0.76 | 6.6 | 42.4 | 0.37 | 1.65 | 46 | 3.4 | 2–3 | $10^{10}$ |
| 27 | 0.75 | 6.3 | 42.1 | 0.28 | 1.71 | 42 | 2.8 | 2–3 | $10^{11}$ |
| 28 | 0.68 | 5.7 | 39.1 | 0.04 | 1.71 | 15 | 0.9 | 3 | $10^{13}$ |
| 29 | 0.59 | 4.5 | 37.6 | 0.06 | 1.64 | 18 | 1.1 | 2 | $10^{12}$ |

Example 30

An aromatic polyamide fiber sheet was produced by the same procedures as in Example 10 with the following exceptions.

The fiber sheet was prepared from:

(1) 15% by weight of the same aromatic polyamide staple fibers (A) as in Example 4, having a fiber length of 3 mm and an equilibrium moisture content of 1.6%;

(2) 70% by weight of copoly(p-phenylene/3,4'-oxydiphenylene terephthalamide staple fibers (B) (trademark: TECHNORA, made by TEIJIN) having an individual fiber thickness of 1.67 d tex (1.50 denier), a fiber length of 3 mm and an equilibrium moisture content of 1.8% and surface-coated with 0.5% by weight of talc and 0.1% by weight of osmose;

(3) 7.5% by weight of copoly(p-phenylene/3,4'-oxydiphenylene terephthalamide) fibrids having an equilibrium moisture-content of 4.1%, as heat-resistant organic polymer fibrids; and (4) 7.5% by weight of a water-dispersible epoxy resin binder which was applied in the state of an aqueous dispersion thereof having a solid content of 1% by weight by a spray method to a precursory fiber sheet formed from the above-mentioned fibers (1) and (2) and fibrids (3), during the fiber sheet-forming procedure.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Example 31

An aromatic polyamide fiber sheet was produced by the same procedures as in Example 30 with the following exceptions.

A half amount by solid weight of the water-dispersible epoxy resin binder applied by the spray method was replaced by a water-dispersible phenol resin binder in the state of an aqueous dispersion having a solid content of 20% by weight (made by SHOWA KOBUNSHI).

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Example 32

An aromatic polyamide fiber sheet was produced by the same procedures as in Example 10 with the following exceptions.

The copoly(p-phenylene/3,4'-oxydiphenylene terephthalamide fibrids were replaced by fibrids comprising a wholly aromatic polyester fibrids (made by KURARAY) having a liquid crystalline property when method.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Example 33

An aromatic polyamide fiber sheet was produced by the same procedures as in Example 10 with the following exceptions.

The copoly(p-phenylene/3,4'-oxydiphenylene terephthalamide fibrids were replaced by poly-p-phenylene benzobis-thiazole fibrids.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Examples 34 to 39 and Comparative Examples 10 to 13

In each of Examples 34 to 39 and Comparative Examples 10 to 13, an aromatic polyamide fiber sheet was produced by the same procedures as in Example 10 with the following exceptions.

The high calendering temperature and pressure of Example 10 were changed to as shown in Table 4.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Comparative Examples 14 to 16

In each of Comparative Examples 14 to 16, an aromatic polyamide fiber sheet was produced by the same procedures as in Example 10 with the following exceptions.

The aromatic polyamide staple fibers used in Example 10 were replaced by the same aromatic polyamide fibers in Comparative Example 14 as in Comparative Example 1, in Comparative Example 15 as in Comparative Example 2, and in Comparative Example 16 as in Comparative Example 3.

The principal sheet-forming conditions of the fiber sheet is shown in Table 4, and the properties of the resultant fiber sheet evaluated by the above-mentioned tests are shown in Table 5.

The fiber sheet of Comparative Example 14 was subjected to the impurity ion content test (6) and the equilibrium moisture content Test (4)-B.

In the test results, the extracted sodium ion content was 76.9 mg/liter, the extracted potassium ion content was 5.3 mg/liter, the extracted chlorine ion content was 11.9 mg/liter and the equilibrium moisture content was 2.72%. Thus the fiber sheet was unsuitable for electric insulating materials.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Examples 40 and 41

In each of Examples 40 and 41, an aromatic polyamide fiber sheet was produced by the same procedures as in Example 10 with the following exceptions.

The fiber sheet was prepared from:

(1) the same aromatic polyamide staple fibers (A) as in Example 1, having a fiber length of 3 mm and an equilibrium moisture content of 3.1%;

(2) copoly(p-phenylene/3,4'-oxydiphenylene terephthalamide staple fibers (B) (trademark: TECHNORA, made by TEIJIN) having an individual fiber thickness of 1.67 d tex (1.50 denier), a fiber length of 3 mm and an equilibrium moisture content of 1.8% and surface-coated with 0.5% by weight of talc and 0.1% by weight of osmose;

(3) copoly(p-phenylene/3,4'-oxydiphenylene terephthalamide) staple fibers (D) (TECHNORA, made by TEIJIN) having an ultimate elongation of 65.7%, an individual fiber thickness of 3.33 d tex (3.00 denier) and a fiber length of 5 mm;

(4) as heat-resistant organic polymer fibrids, copoly(p-phenylene/3,4'-oxydiphenylene terephthalamide) fibrids (made by TEIJIN) having an equilibrium moisture content of 4.1%, in the mixing proportions shown in Table 4.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Example 42

An aromatic polyamide fiber sheet was produced by the same procedures as in Example 41 with the following exceptions.

As the staple fibers (D), copoly(p-phenylene/3,4'-oxydiphenylene terephthalamide) staple fibers (D) (trademark: TECHNORA, made by TEIJIN) having an individual fiber thickness of 2.44 d tex (2.2 denier), a fiber length of 5 mm, and an ultimate elongation of 32.3% were employed.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Example 43

An aromatic polyamide fiber sheet was produced by the same procedures as in Example 41 with the following exceptions.

As the staple fibers (D), copoly(p-phenylene/3,4'-oxydiphenylene terephthalamide staple fibers (trademark: TECHNORA, made by TEIJIN) having an individual fiber thickness of 3.33 d tex (3.0 denier) a fiber length of 5 mm and an ultimate elongation of 13.5% were used.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Example 44

An aromatic polyamide fiber sheet was produced by the same procedures as in Example 41 with the following exceptions.

As the heat resistant organic polymer fibrids, copoly(p-phenylene/3,4'-oxydiphenylene terephthalamide fibers (made by TEIJIN) having an equilibrium moisture content of 4.1% were used in an amount of 7.5% by weight, and a water-dispersible epoxy resin binder was applied in a solid amount of 7.5% by weight in the state of an aqueous dispersion having a solid content of 10% by weight to precursory fiber sheet comprising the staple fibers (1), (2) and (3) and the above-mentioned fibrids.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Comparative Example 17

An aromatic polyamide fiber sheet was produced by the same procedures as in Example 41 with the following exceptions.

In place of the aromatic polyamide staple fibers (D) used in Example 41, the same aromatic polyamide staple fibers as in Comparative Example 1 having a fiber length of 3 mm and an equilibrium moisture content of 6.9% were employed.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

Comparative Example 18

An aromatic polyamide fiber sheet was produced by the same procedures as in Example 42 with the following exceptions.

In place of the aromatic polyamide staple fibers (A) used in Example 42, the same aromatic polyamide staple fibers as in Comparative Example 1 having a fiber length of 3 mm and an equilibrium moisture content of 6.9% were employed, and in place of the staple fibers (B) used in Example 42, copoly(p-phenylene/3,4'-oxydiphenylene terephthalamide staple fibers (trademark: TECHNORA, made by TEIJIN) having an ultimate elongation of 13.5%, an individual fiber thickness of 3.33 d tex (3.0 denier) and a fiber length of 5 mm were employed.

The principal sheet-forming conditions of the fiber sheet is shown in Table 4, and the properties of the resultant fiber sheet evaluated by the above-mentioned tests are shown in Table 5.

A pre-preg was produced by impregnating the fiber sheet with the varnish composition by the procedures as shown in Test (12), and a laminate for an electric circuit board was produced from the pre-preg and subjected to the tests (12), (13) and (14). The test results are shown in Table 5.

TABLE 4

| Item Example No. | | Mixing proportions of component staple fibers and binder | | | High calendering conditions | |
|---|---|---|---|---|---|---|
| | | Staple fibers A/B | Staple fibers C/D/E | Binder Fibrids resin | Temperature (° C.) | Linear pressure (kg/cm) |
| Example | 30 | 15/70 | 0/0/0 | 7.5/7.5 | 320 | 200 |
| | 31 | 15/70 | 0/0/0 | 7.5/7.5 | 320 | 200 |
| | 32 | 15/75 | 0/0/0 | 10/0 | 320 | 200 |
| | 33 | 15/75 | 0/0/0 | 10/0 | 320 | 200 |
| | 34 | 15/75 | 0/0/0 | 10/0 | 240 | 200 |
| | 35 | 15/75 | 0/0/0 | 10/0 | 280 | 200 |
| | 36 | 15/75 | 0/0/0 | 10/0 | 350 | 200 |
| | 37 | 15/75 | 0/0/0 | 10/0 | 380 | 200 |
| | 38 | 15/75 | 0/0/0 | 10/0 | 320 | 170 |
| | 39 | 15/75 | 0/0/0 | 10/0 | 320 | 240 |
| Comparative Example | 10 | 15/75 | 0/0/0 | 10/0 | 180 | 200 |
| | 11 | 15/75 | 0/0/0 | 10/0 | 430 | 200 |
| | 12 | 15/75 | 0/0/0 | 10/0 | 320 | 120 |
| | 13 | 15/75 | 0/0/0 | 10/0 | 320 | 300 |
| | 14 | 15/75 | 0/0/0 | 10/0 | 320 | 200 |
| | 15 | 15/75 | 0/0/0 | 10/0 | 320 | 200 |
| | 16 | 15/75 | 0/0/0 | 10/0 | 320 | 200 |
| Example | 40 | 5/70 | 0/15/0 | 10/0 | 320 | 200 |
| | 41 | 30/45 | 0/15/0 | 10/0 | 320 | 200 |
| | 42 | 55/20 | 0/15/0 | 10/0 | 320 | 200 |
| | 43 | 30/45 | 0/15/0 | 10/0 | 320 | 200 |
| | 44 | 30/45 | 0/15/0 | 7.5/7.5 | 320 | 200 |
| Comparative Example | 17 | 30/45 | 0/15/0 | 10/0 | 320 | 200 |
| | 18 | 55/20 | 0/15/0 | 10/0 | 320 | 200 |

[Note]

Staple fibers A: Poly-p-phenylene terephthalamide staple fibers

Staple fibers B: Copoly(p-phenylene/3,4'-oxydiphenylene terephthalamide staple fibers Staple fibers C: Poly-m-phenylene isophthalamide staple fibers Staple fibers D: Copoly(p-phenylene/3,4'-oxydiphenylene terephthalamide staple fibers having an ultimate elongation of 8% or more Staple fibers E: Heat resistant organic polymer staple fibers different from the staple fibers A, B, C and D

TABLE 5

Properties of heat resistant fiber sheet

| Item Example No. | | Bulk density (g/cm$^3$) | Tensile strength (kg/15 mm) | Interlaminor peeling strength g/15 mm | Thermal dimensional change (%) | Equilibrium moisture content (%) | Dimensional change due to moisture absorption and desorption ($\mu$m) | Electric circuit board laminate | | |
|---|---|---|---|---|---|---|---|---|---|---|
| | | | | | | | | Deformation (mm) | Cutting processability | Surface resistivity ($\Omega$/cm) |
| Example | 30 | 0.66 | 5.2 | 39.2 | 0.08 | 2.19 | 24 | 1.4 | 3 | $10^{13}$ |
| | 31 | 0.48 | 2.9 | 9.8 | 0.26 | 2.17 | 43 | 2.6 | 3 | $10^{13}$ |
| | 32 | 0.67 | 5.3 | 40.8 | 0.06 | 1.61 | 24 | 1.2 | 2–3 | $10^{12}$ |
| | 33 | 0.65 | 5.1 | 38.8 | 0.03 | 1.60 | 15 | 0.8 | 3 | $10^{13}$ |
| | 34 | 0.48 | 2.1 | 14.5 | 0.32 | 1.97 | 39 | 3.3 | 2–3 | $10^{11}$ |
| | 35 | 0.61 | 3.7 | 19.8 | 0.04 | 1.96 | 22 | 0.9 | 3 | $10^{13}$ |
| | 36 | 0.78 | 7.6 | 44.7 | 0.01 | 1.94 | 31 | 0.4 | 3 | $10^{12}$ |
| | 37 | 0.95 | 8.5 | 50.1 | 0.01 | 1.91 | 42 | 0.5 | 2–3 | $10^{11}$ |
| | 38 | 0.47 | 3.1 | 23.1 | 0.04 | 1.97 | 34 | 1.1 | 2–3 | $10^{11}$ |
| | 39 | 0.53 | 3.4 | 30.6 | 0.02 | 1.95 | 41 | 0.7 | 3 | $10^{12}$ |
| Comparative Example | 10 | 0.39 | 1.4 | 11.2 | 0.19 | 2.07 | 45 | 2.1 | 2 | $10^{9}$ |
| | 11 | 0.97 | 8.8 | 52.2 | 0.38 | 1.81 | 56 | 3.5 | 2 | $10^{8}$ |
| | 12 | 0.41 | 1.5 | 18.5 | 0.05 | 2.11 | 37 | 0.9 | 2 | $10^{10}$ |
| | 13 | 0.61 | 4.2 | 38.1 | 0.08 | 1.84 | 53 | 1.4 | 2–3 | $10^{11}$ |
| | 14 | 0.52 | 3.7 | 37.8 | 0.03 | 2.72 | 25 | 0.9 | 1 | $10^{8}$ |
| | 15 | 0.64 | 4.8 | 40.2 | 0.03 | 2.39 | 22 | 0.9 | 1 | $10^{9}$ |
| | 16 | 0.68 | 5.5 | 41.0 | 0.00 | 1.92 | 4 | 0.4 | 1–2 | $10^{8}$ |
| Exampie | 40 | 0.71 | 6.1 | 45.9 | 0.02 | 2.22 | 5 | 0.6 | 3 | $10^{13}$ |
| | 41 | 0.63 | 5.7 | 46.2 | 0.01 | 2.57 | 3 | 0.5 | 3 | $10^{13}$ |
| | 42 | 0.55 | 5.2 | 44.5 | 0.00 | 2.87 | 2 | 0.2 | 3 | $10^{12}$ |
| | 43 | 0.49 | 4.4 | 38.8 | 0.02 | 2.64 | 4 | 0.6 | 3 | $10^{13}$ |
| | 44 | 0.59 | 5.4 | 44.7 | 0.01 | 2.57 | 5 | 0.8 | 3 | $10^{13}$ |
| Comparative Example | 17 | 0.65 | 6.1 | 47.1 | 0.05 | 3.65 | 19 | 1.2 | 1 | $10^{9}$ |
| | 18 | 0.51 | 4.8 | 42.4 | 0.08 | 4.82 | 12 | 0.9 | 1–2 | $10^{8}$ |

What is claimed is:

1. A wholly aromatic polyamide fiber sheet comprising,
(A) 60 to 96% by weight of wholly aromatic polyamide staple fibers comprising wholly aromatic polyamide crystals having apparent crystal sizes determined from a wide angle X-ray diffraction intensity curve in accordance with Scherrer's equation and satisfying the requirements (1), (2), (3) and (4):
 (1) the crystal size (A) in a (110) plane is 7.5 nm (75 angstroms) or more,
 (2) the crystal size (B) in a (200) plane is 8.2 nm (82 angstroms) or more,
 (3) the product (A×B) of the crystal size (A) and the crystal size (B) is 61.50 to 630.00, and
 having a thermal linear expansion coefficient within the range of from $-1.0 \times 10^{-6}$/° C. to $-7.5 \times 10^{-6}$/° C., and
 (4) when the wholly aromatic polyamide stable fibers in an amount of 2 g are cut to a short length of 1 mm or less, immersed in 50 ml of a distilled water, and heat-treated in an autoclave at a temperature of 121° C. under a pressure of 2 kg/cm$^2$G, to extract impurity ions from the fibers; the extracted impurity ion-containing water is subjected to an ICP analysis and to a chromatographic analysis to determine the amount of the extracted impurity sodium, potassium and chlorine ions per liter of the extracted impurity ion-containing water; and the extracted impurity ions satisfy the requirements (a), (b) and (c):
 (a) the amount of the extracted sodium ions is not more than 40 mg/liter,
 (b) the amount of the extracted potassium ions is not more than 3.0 mg/liter, and
 (c) the amount of the extracted chlorine ions is not more than 7.5 mg/liter, and
(B) 4 to 40% by weight of at least one member selected from the group consisting of organic resin binders and heat-resistant organic polymer fibers.

2. The wholly aromatic polyamide fiber sheet as claimed in claim 1, wherein the wholly aromatic polyamide crystals satisfy the requirements (1), (2) and (3):
 (1) the crystal size (A) in the (110) plane is 10.0 nm or more,
 (2) the crystal size (B) in the (200) plane is 8.5 nm or more, and
 (3) the product (A×B) is 85.00 to 630.00, and
 the coefficient of the linear thermal expansion of the wholly aromatic polyamide fiber is within the range of from $-1.0 \times 10^{-6}$/° C. to $-6.5 \times 10^{-6}$/° C.

3. The wholly aromatic polyamide fiber sheet as claimed in claim 1, wherein the wholly aromatic polyamide fiber has a thermal history.

4. The wholly aromatic polyamide fiber sheet as claimed in claim 1, wherein the wholly aromatic polyamide fiber has been subjected to a water-washing treatment.

5. The wholly aromatic polyamide fiber sheet as claimed in claim 1, wherein the wholly aromatic polyamide fiber exhibits an ultimate elongation of 3.2% or less.

6. The wholly aromatic polyamide fiber sheet as claimed in claim 1, wherein the wholly aromatic polyamide fiber has a specific gravity of 1.447 or more and an equilibrium moisture content of 3.2% or less.

7. The wholly aromatic polyamide fiber sheet as claimed in claim 1, wherein the wholly aromatic polyamide is a poly-p-phenylene terephthalamide.

8. The wholly aromatic polyamide fiber sheet as claimed in claim 1, wherein the wholly aromatic polyamide staple fibers comprise 4 to 100% by weight of poly-p-phenylene terephthalamide fibers in the form of staple fibers.

9. The wholly aromatic polyamide fiber sheet as claimed in claim 8, wherein the aromatic polyamide staple fibers comprise:
3 to 50% by weight of at least one member selected from the group consisting of meta-type aromatic polyamide staple fibers and p-type aromatic polyamide staple fibers having an ultimate elongation of 6% or more; and
50 to 97% by weight of the poly-p-phenylene terephthalamide staple fibers.

10. The wholly aromatic polyamide fiber sheet as claimed in claim 8, wherein the wholly aromatic polyamide staple fibers comprise:
3 to 30% by weight of at least one member selected from the groups consisting of meta-type aromatic polyamide staple fibers and para-type aromatic polyamide staple fibers having an ultimate elongation of 6% or more,
4 to 70% by weight of the poly-p-phenylene terephthalamide staple fibers; and
93% by weight or less of copoly-p-phenylene/3,4'-oxydiphenylene terephthalamide staple fibers.

11. The wholly aromatic polyamide fiber sheet as claimed in claim 10, wherein the copoly-p-phenylene/3,4'-oxydiphenylene terephthalamide staple fibers have solid inorganic compound layers having a cation-exchanging property and a nonion-absorbing property and fixed to the peripheral surfaces of the staple fibers.

12. The wholly aromatic polyamide fiber sheet as claimed in claim 9 or 10, wherein the meta-type aromatic polyamide staple fibers are selected from poly-m-phenylene isophthalamide staple fibers.

13. The wholly aromatic polyamide fiber sheet as claimed in claim 9 or 10, wherein the para-type aromatic polyamide staple fibers having an ultimate elongation of 6% or more are selected from copoly-p-phenylene/3,4'-oxydiphenylene terephthalamide staple fibers.

14. The wholly aromatic polyamide fiber sheet as claimed in claim 9 or 10, wherein the para-type aromatic polyamide staple fibers having an ultimate elongation of 6% or more are selected from copoly-p-phenylene/3,4'-oxydiphenylene terephthalamide staple fibers to the peripheral surfaces of which, inorganic compound particles having a cation-exchanging property and a non-ion-absorbing property are fixed.

15. The wholly aromatic polyamide fiber sheet as claimed in claim 1, further comprising, in addition to the aromatic polyamide staple fibers, heterocyclic polymer staple fibers.

16. The wholly aromatic polyamide fiber sheet as claimed in claim 1, further comprising, in addition to the aromatic polyamide staple fibers, wholly aromatic polyester staple fibers exhibiting a liquid crystalline property when melted.

17. The wholly aromatic polyamide fiber sheet as claimed in claim 1, further comprising, in addition to the aromatic polyamide staple fibers, polyphenylenesulfide staple fibers.

18. The wholly aromatic polyamide fiber sheet as claimed in claim 1, further comprising, in addition to the aromatic polyamide staple fibers, polyetherimide staple fibers.

19. The wholly aromatic polyamide fiber sheet as claimed in claim 1, further comprising, in addition to the aromatic polyamide staple fibers, polyether-etherketone staple fibers.

20. The wholly aromatic polyamide fiber sheet as claimed in claim 1, further comprising polytetrafluoroethylene staple fibers.

21. The wholly aromatic polyamide fiber sheet as claimed in claim 1, wherein the organic resin binder comprises an epoxy resin having at least one functional epoxy group per molecule thereof.

22. The wholly aromatic polyamide fiber sheet as claimed in claim 1, wherein the organic resin binder comprises an aqueous dispersion comprising at least one member selected from the group consisting of epoxy resins, phenol-formaldehyde resins, melamine-formaldehyde resins, and fluorine-containing resins.

23. The wholly aromatic polyamide fiber sheet as claimed in claim 1, wherein the heat-resistant organic polymer fibrides are selected from the group consisting of poly-p-phenylene terephthalamide fibrids and copoly-p-phenylene/3,4'-oxydiphenylene terephthalamide fibrids.

24. The wholly aromatic polyamide fiber sheet as claimed in claim 1, wherein the heat resistant organic polymer fibrides are selected from poly-m-phenylene isophthalamide fibrids.

25. The wholly aromatic polyamide fiber sheet as claimed in claim 1, wherein the heat-resistant organic polymer fibrids are selected from wholly aromatic polyester fibrids exhibiting a liquid crystalline property when melted.

26. The wholly aromatic polyamide fiber sheet as claimed in claim 1, wherein the heat-resistant organic polymer fibrids are selected from heterocyclic polymer fibrids.

27. The wholly aromatic polyamide fiber sheet as claimed in claim 1, having a maximum change in the longitudinal dimension of 50 μm or less per length of 20 mm, determined by such a test method for dimensional change of a sheet due to moisture-absorption and desorption of the sheet, that a sample of the sheet having a length of 20 mm and a width of 5 mm is left standing in the ambient atmosphere at room temperature at a relative humidity of 85% RH or more for 120 hours or more to allow the sheet to fully absorb moisture; the moisture-absorbed sheet sample is subjected to heating to a temperature of 280° C. at a heating rate of 10° C./minute, then to cooling to room temperature at a cooling rate of 10° C./minute to dry the sheet sample, the above-mentioned heating and cooling procedures being repeated three times in total under the same conditions as mentioned above; and a maximum change in the longitudinal dimension of the sheet sample generated during the repeated heating and cooling procedures is measured per 20 mm in the longitudinal dimension.

28. The wholly aromatic polyamide fiber sheet as claimed in claim 1, having a tensile strength of 1.7 kg/15 mm or more and an interlaminar peeling strength of 13 g/15 mm or more each in the longitudinal and transverse directions of the sheet.

29. The wholly aromatic polyamide fiber sheet as claimed in claim 1, having an equilibrium moisture content of 2.7% or less.

30. The wholly aromatic polyamide fiber sheet as claimed in claim 1, wherein the staple fibers have a fiber length of 1.0 to 10 mm.

31. A method of producing a wholly aromatic polyamide fiber sheet as claimed in claim 1 in the form of staple fiber, comprising; preparing an aqueous staple fiber slurry by dispersing aromatic polyamide staple fibers containing the above-mentioned wholly aromatic polyamide fibers in the form of staple fibers and heat resistant organic polymer fibrids in an aqueous medium; subjecting the aqueous staple fiber slurry to a paper-forming procedure; drying the resultant wet paper-like sheet; heat-pressing the dried sheet at a temperature of 210 to 400° C. under a linear pressure of 150 to 250 kg/cm, to partial soften, or melt or soften and melt the heat-resistant organic polymer fibrids in the dried sheet and thereby to causing the fibrids to be bonded to each other and to the aromatic polyamide staple fibers.

32. A pre-preg comprising the aromatic polyamide fiber sheet as claimed in claim 1, the aromatic polyamide fiber sheet being impregnated with a thermosetting resin.

33. A shaped article produced by shaping and heat-pressing the aromatic polyamide fiber sheet-containing pre-preg as claimed in claim 32.

34. A laminate plate produced from the aromatic polyamide fiber sheet-containing pre-preg as claimed in claim 32.

35. A perforated shaped article produced by perforating the shaped article as claimed in claim 33 by a laser-perforation method.

36. A perforated laminate plate produced by perforating the laminate plate as claimed in claim 34 by a laser-perforation method.

* * * * *